(12) United States Patent
Park et al.

(10) Patent No.: US 9,064,822 B2
(45) Date of Patent: Jun. 23, 2015

(54) ORGANIC ELECTROLUMINESCENT DEVICE AND METHOD OF MANUFACTURING THE SAME

(71) Applicant: LG Display Co., Ltd., Seoul (KR)

(72) Inventors: Sung-Jin Park, Paju-si (KR); Joung-Ho Ryu, Seoul (KR); Sang-Moo Song, Gumi-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/140,078

(22) Filed: Dec. 24, 2013

(65) Prior Publication Data

US 2015/0102291 A1    Apr. 16, 2015

(30) Foreign Application Priority Data

Oct. 10, 2013    (KR) .......................... 10-2013-0120847

(51) Int. Cl.
*H01L 29/08*  (2006.01)
*H01L 27/32*  (2006.01)
*H01L 51/56*  (2006.01)
*H01L 51/52*  (2006.01)

(52) U.S. Cl.
CPC .......... *H01L 27/3216* (2013.01); *H01L 27/322* (2013.01); *H01L 27/3276* (2013.01); *H01L 51/56* (2013.01); *H01L 51/5253* (2013.01)

(58) Field of Classification Search
CPC .............. H01L 27/3216; H01L 27/322; H01L 27/3276; H01L 51/56; H01L 51/5253
USPC ................................................ 257/40; 438/29
See application file for complete search history.

(56) References Cited

U.S. PATENT DOCUMENTS

| 2007/0200492 A1* | 8/2007 | Cok et al. ........................ 313/506 |
| 2014/0231753 A1* | 8/2014 | Chen et al. ....................... 257/40 |
| 2014/0374697 A1* | 12/2014 | Liu et al. ......................... 257/13 |

* cited by examiner

*Primary Examiner* — Trung Q Dang
(74) *Attorney, Agent, or Firm* — McKenna Long & Aldridge LLP

(57) ABSTRACT

An organic electroluminescent display includes: a first substrate including a plurality of pixel regions, each having three sub-pixel regions; a first electrode in each sub-pixel region on the first substrate; an organic light emitting layer in each pixel region on the first electrode; a second electrode on the organic light emitting layer; a second substrate facing the first substrate; and quantum dot layers on an inner surface of the second substrate and corresponding to at least two of the three sub-pixel regions.

18 Claims, 9 Drawing Sheets

ORGANIC ELECTROLUMINESCENT DEVICE AND METHOD OF MANUFACTURING THE SAME

The present application claims the priority benefit of priority to Korean Patent Application No. 10-2013-0120847 filed in Republic of Korea on Oct. 10, 2013, which are hereby incorporated by reference for all purposes as if fully set forth herein.

BACKGROUND OF THE INVENTION

1. Field of the Invention

The present invention relates to an organic electroluminescent device and method for manufacturing the same.

2. Discussion of the Related Art

An organic electroluminescent device is one of flat panel displays and has advantages of high luminance and low driving voltage. Further, since it is a self-luminescent type, it has high contrast ratio, thin profile, wide viewing angle, stability at low temperatures, easy displaying images due to a response speed of about several microseconds, and simple fabrication and design of driving circuit due to its low driving voltage of DC 5V to 15V.

Accordingly, the organic electroluminescent device is used various IT devices such as TVs, monitors and cell phones.

FIG. 1 is a schematic cross-sectional view illustrating a pixel region having three sub-pixel regions emitting red (R), green (G) and blue (B) of an organic electroluminescent device according to the related art. In FIG. 1, an organic light emitting diode E is mainly shown.

Referring to FIG. 1, the organic electroluminescent device 1 includes a substrate 10 having an organic light emitting diode E thereon and an opposing substrate 30 for encapsulation.

On the substrate 10 are gate lines and data lines 12 crossing each other to define sub-pixel regions SP1 to SP3, a power line parallel with one of the gate line and the data line 12, array elements in the sub-pixel regions SP1 to SP3, the organic light emitting diode E connected to a part of the array elements. The opposing substrate 30 functions to prevent moisture and oxygen from permeating into the organic light emitting diode E.

Even though not shown in the drawings, the array elements include a switching thin film transistor (TFT) connected to the gate line and the data line 12, and a driving TFT connected to the organic light emitting diode E. The organic light emitting diode E includes a first electrode 15 connected to the driving TFT, an organic light emitting layer 20, and a second electrode 25.

A pixel region P is composed of the three sub-pixel regions SP1 to SP3, and the sub-pixel regions SP1 to SP3 include the respective organic light emitting layers 20 emitting red, green and blue.

The organic electroluminescent device 1 display images by light emission to the first electrode 15 or the second electrode 25. Recently, considering aperture ratio, a top emission type organic electroluminescent device is manufactured that emits light to the second electrode 25 i.e., the opposing substrate 30.

FIG. 2 is a schematic view illustrating a thermal deposition method using a metal mask according to the related art.

An organic light emitting material 71 in powder form for the organic light emitting layer (20 of FIG. 1) is put in a thermal deposition device 70 having a heating means that is at bottom and side surfaces and applies entirely heat to the device 70.

In a chamber maintaining a vacuum state, when the heating means of the device 70 is operated and apply heat to the device 70, the heat is transferred to the organic light emitting material 71.

Accordingly, the organic light emitting material 71 is sublimated. The organic light emitting material gas 72 is emitted through an outlet of the device 70.

The organic light emitting material gas 72 is selectively deposited in the sub-pixel regions SP1 to SP3 on the substrate 50 through a metal mask 60 having opening portions OA1 and OA2 over the outlet of the device 70 to form an organic light emitting layer on a substrate 50.

Regarding the metal mask 60, a metal plate are patterned at both of a top surface and a bottom surface in a mask process, for example, including deposition of photoresist, light exposure, developing and etching to form the opening portions OA1 and OA2, and a shielding portion SA located between the adjacent opening portions OA1 and OA2. The opening portion OA1 at the top surface has an area different from that of the opening portion OA2 at the bottom surface.

The patterning process to form the metal mask 60 is relevant to an etching rate of the metal material of the metal mask 60 and a thickness t of the metal mask 30. In case of etching the shadow mask 60 in one direction, size difference of each of the opening portions OA1 and OA2 occurs much, and error due to area difference between the opening portions OA1 and OA2 for each location occurs much. To prevent this, the simultaneous etching for the top surface and the bottom surface is performed.

Accordingly, the area of the opening portions OA1 and OA2, and in more detail, the width (that is a width of the opening portion at the surface facing the substrate 50) is required to be at least 32 um in order that the width is in the error range permissible in fabrication.

In case that the width A of the opening portion facing the substrate 50 is less than 32 um, the opening portion OA2 at the bottom surface of the metal mask 60 should have a greater area if the thickness t of the metal mask 60 is constant.

In this case, a portion between the adjacent opening portions OA2 i.e., a width of a rib portion is very small, and this causes reduction of hardness of the metal mask 60, and thus when the metal mask 60 sags, shape deformation of the opening portions occurs.

The reduction of the thickness t of the metal mask 60 can solve this problem. However, the thickness of the shadow mask made of metal material is usually limited to 40 um, and a metal plate less than 40 um may not be produced and thus fabricating the metal mask having such thickness may be impossible.

Even though such thickness is allowed, a bearing power between each of the opening portions OA1 and OA2 becomes less and thus sagging becomes more problematic.

Moreover, when forming large-sized organic electroluminescent device having 10 inches or more, increase of the area of the metal mask 60 is required, and in this case, the metal mask 60, particularly a center portion thereof sags much due to increase of weight, and formation error of the organic light emitting layer occurs much. Accordingly, fabricating the organic electroluminescent device having large size of at least 10 inches and having high resolution of at least 250 PPI (pixels per inch) using the metal mask 60 may become difficult.

Thus, what is beneficially needed is an organic electroluminescent and method of manufacturing the same to which a thermal deposition method using a metal mask is applicable, and which can have a large size of at least 10 inches with a high resolution.

SUMMARY OF THE INVENTION

Accordingly, the present invention is directed to an organic electroluminescent device and method for manufacturing the same that substantially obviates one or more of the problems due to limitations and disadvantages of the related art.

An advantage of the present invention is to provide an organic electroluminescent device and method for manufacturing the same that is capable of having a high resolution and large size.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, an organic electroluminescent device may, for example, include: a first substrate including a plurality of pixel regions, each having three sub-pixel regions; a first electrode in each sub-pixel region on the first substrate; an organic light emitting layer in each pixel region on the first electrode; a second electrode on the organic light emitting layer; a second substrate facing the first substrate; and quantum dot layers on an inner surface of the second substrate and corresponding to at least two of the three sub-pixel regions.

In another aspect, a method of manufacturing an organic electroluminescent device that includes a plurality of pixel regions, each having three sub-pixel regions includes: forming a first electrode in each sub-pixel region on a first substrate; forming an organic light emitting layer in each pixel region on the first electrode; forming a second electrode on the organic light emitting layer; forming quantum dot layers on an inner surface of a second substrate facing the first substrate and corresponding to at least two of the three sub-pixel regions; and coupling the first and second substrates.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to exemplary embodiments, examples of which are illustrated in the accompanying drawings.

Figure 1:
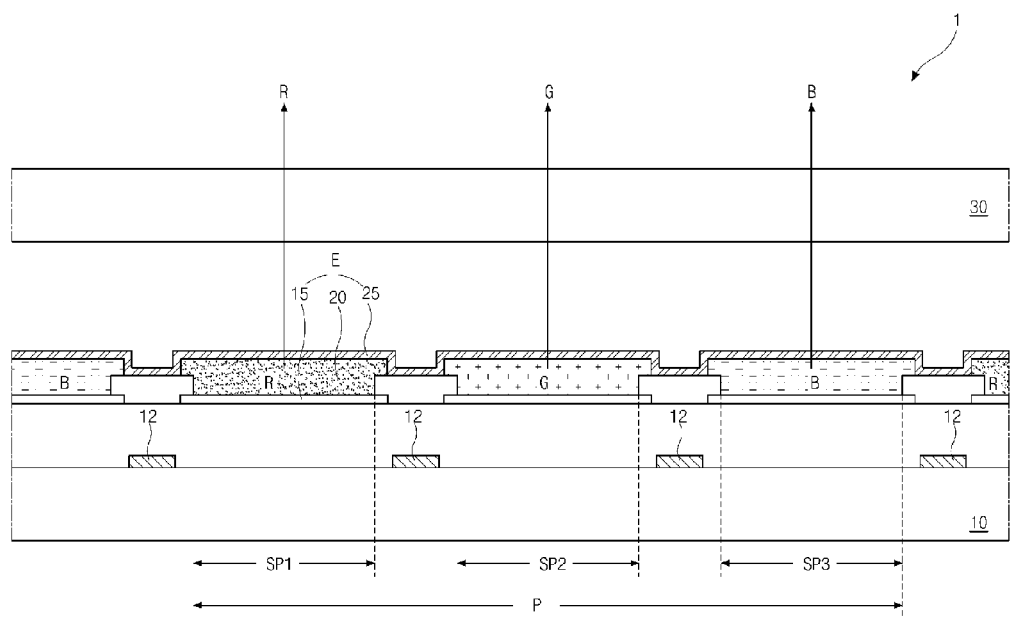
FIG. 1 is a schematic cross-sectional view illustrating a pixel region having three sub-pixel regions emitting red (R), green (G) and blue (B) of an organic electroluminescent device according to the related art.
Figure 2:
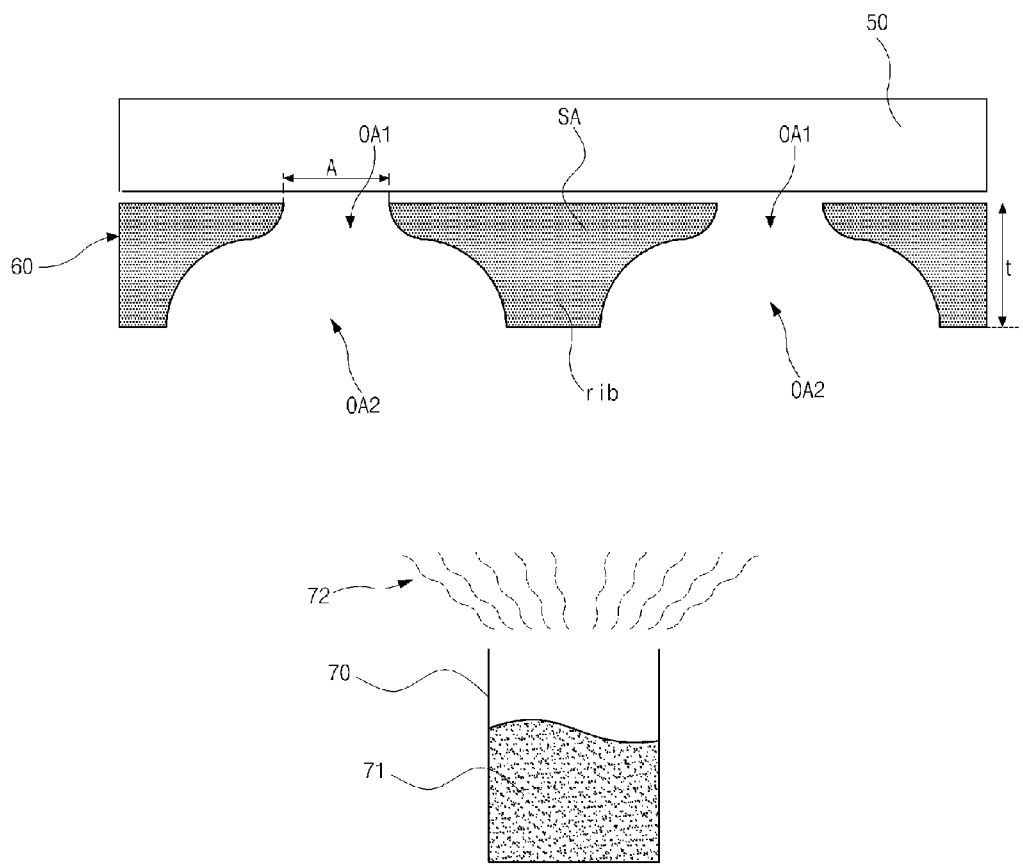
FIG. 2 is a schematic view illustrating a thermal deposition method using a metal mask according to the related art.
Figure 3:
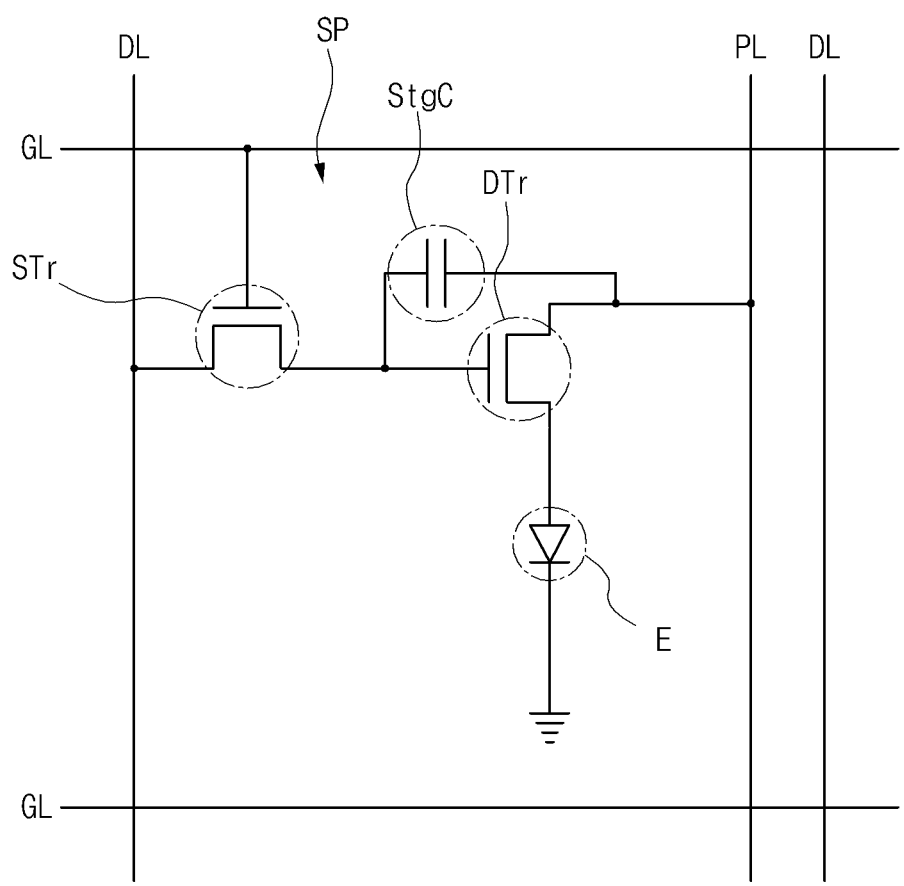
FIG. 3 is a circuit diagram illustrating an organic electroluminescent device according to an embodiment of the present invention.

FIG. 3 is a circuit diagram illustrating an organic electroluminescent device according to an embodiment of the present invention.

Referring to FIG. 3, a sub-pixel region SP of the organic electroluminescent device includes a switching TFT STr, a driving TFT DTr, a storage capacitor StgC, and an organic light emitting diode E.

A gate line GL is formed along a first direction, and a data line DL is formed along a second direction crossing the first direction to define the sub-pixel region SP. A power line PL supplying a power voltage is spaced apart from the data line DL.

The switching TFT STr is formed at the crossing portion of the gate and data lines GL and DL, and a driving TFT DTr is connected to the switching TFT STr.

A first electrode of the organic light emitting diode E is connected to a drain electrode of the driving TFT DTr, and a second electrode of the organic light emitting diode E is grounded. A source electrode of the driving TFT DTr is connected to the power line PL.

The storage capacitor StgC is connected between a gate electrode and the source electrode of the driving TFT DTr.

When a gate signal is applied to the gate line GL, the switching TFT STr is turned on, and a data signal is supplied from the data line DL to the gate electrode of the driving TFT DTr. Accordingly, the driving TFT DTr is turned on, and the organic light emitting diode E emits light.

An amount of current flowing to the organic light emitting diode E is determined depending on the data voltage supplied to the driving TFT DTr, and thus gray scale is realized. Since the storage capacitor StgC maintains the voltage of the gate electrode of the driving TFT DTr, even when the switching TFT STr is turned off, the amount of the current flowing into the organic light emitting diode E is maintained.

Figure 4:
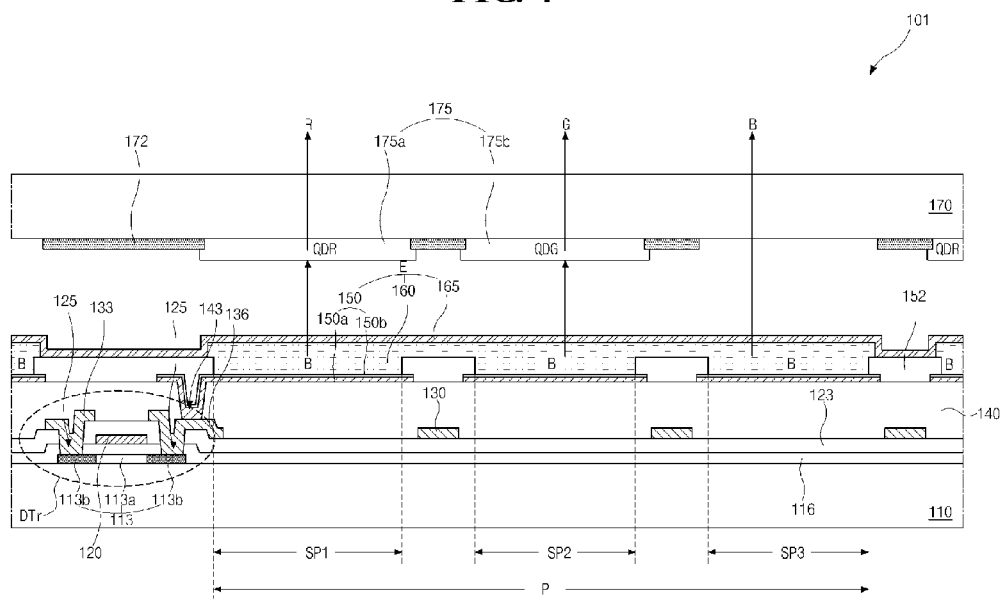
FIG. 4 is a cross-sectional view illustrating the organic electroluminescent device according to an embodiment of the present invention.

FIG. 4 is a cross-sectional view illustrating the organic electroluminescent device according to the embodiment of the present invention. In FIG. 4, one pixel region P having three sub-pixel regions SP1 to SP3 is shown. For the purpose of explanations, a region where the switching TFT or driving TFT DTr is formed is referred to as an element region, and the driving TFT DTr of one sub-pixel region SP1 out of the three sub-pixel regions SP1 to SP3 is shown.

Referring to FIG. 4, the organic electroluminescent device 101 includes a first substrate 110 having the switching TFT, the driving TFT DTr, the organic light emitting diode E thereon, and a second substrate 170 for encapsulation having quantum dot layers 175 thereon.

A semiconductor layer 113 is formed in the element region on the first substrate 110. The semiconductor layer 113 may include an active region 113a, made of intrinsic poly silicon, at a center portion as a channel, and ohmic regions 113b, made of highly doped poly silicon at both sides of the active region 113a.

A buffer layer may be formed between the first 110 substrate and the semiconductor layer 113, and may be made of inorganic insulating material, for example, $SiO_2$ or SiNx.

The buffer layer functions to prevent the property of the semiconductor layer 113 from being degraded due to alkali ions emitted from the first substrate 110 for crystallization of the semiconductor layer 113.

A gate insulating layer 116 may be formed entirely on the first substrate 110 covering the semiconductor layer 113. A gate electrode 120 is formed in the element region on the gate insulating layer 116 corresponding to the active region 113a.

The gate line connected to the gate electrode of the switching TFT is formed on the gate insulating layer 116.

An inter-layered insulating film 123 is formed on the gate electrode 120 and the gate line, and may be made of inorganic insulating material, for example, $SiO_2$ or SiNx.

Semiconductor contact holes 125 are formed in the inter-layered insulating film 123 and the gate insulating layer 116 and expose the respective ohmic contact regions 113b.

The data line and the power line are formed on the inter-layered insulating film 123.

Source and drain electrodes 133 and 136 are formed in the element region on the inter-layered insulating film 123 and contacts the respective ohmic contact regions 113b through the respective semiconductor contact holes 125.

The semiconductor layer 113, the gate insulating layer 116, the gate electrode 120, the inter-layered insulating film 123 and the source and drain electrodes 133 and 136 form each of the switching TFT and the driving TFT DTr. The switching TFT is connected to the corresponding gate and data lines, and connected to the driving TFT DTr.

In the drawings, a top gate type TFT is shown. Alternatively, a bottom gate type TFT having a semiconductor layer made of amorphous silicon or oxide semiconductor material may be used, the typical structure of which is well understood by a person of ordinary skill in the art. The bottom gate type TFT may include a gate electrode, a gate insulating layer, an active layer of intrinsic amorphous silicon, ohmic contact layers of impurity-doped amorphous silicon, and source and drain electrodes sequentially formed on a substrate, or a gate electrode, a gate insulating layer, an oxide semiconductor layer, an etch stop layer, and source and drain electrodes sequentially formed on a substrate.

In case of the bottom gate type, a gate line is formed at the same layer of the gate electrode of the TFT, and a data line is formed at the source electrode of the TFT.

A passivation layer 140 is formed on the switching TFT and the driving TFT DTr and includes a drain contact hole 143 exposing the drain electrode 136 of the driving TFT DTr.

The passivation layer 140 may be formed of organic insulating material, for example, photo acryl to have an substantially even plane.

A first electrode 150 is formed on the passivation layer 140 and contacts the drain electrode 136 through the drain contact hole 143.

The first electrode 150 may have a single-layered structure that has a transparent conductive material layer of high work function made of, for example, ITO, or a double-layered structure that has a lower layer 150a made of high reflective material, for example, Al or Al alloy (e.g., AlNd) to increase efficiency of light emission to top side, and an upper layer 150b made of the transparent conductive material.

When the first electrode 150 has the double-layered structure, light emitted from an organic light emitting layer 160 on the first electrode 150 is reflected by the lower layer 150b back to the top side, and thus efficiency of light emission increases and brightness thus increases.

A buffer pattern 152 is formed on the passivation layer 140 at boundary portions among the sub-pixel regions SP1 to SP3 and overlaps an edge portion of the first electrode 150.

The buffer pattern 152 functions to prevent short circuit between the first electrode 150 and a second electrode 165 with the organic light emitting layer 160 therebetween.

The organic light emitting layer 160 emitting a predetermined color is formed on the buffer pattern 152 and the first electrode 150. The organic light emitting layer 160 is separately patterned with each pixel region P as a pattern unit.

The organic light emitting layer 160 is made of a material emitting one of red (R), green (G) and blue (B), and preferably, blue (B).

The blue has the shorter wavelength than the red and blue, and the quantum dot layer 175 has higher fluorescence efficiency for light of short wavelength. Further, in aspect of lifetime and etc., the quantum dot layer 175 is better at fluorescence for blue of short wavelength than at fluorescence for red and green of long wavelength.

However, the organic light emitting layer 160 may be configured to emit red or blue.

Even though the organic light emitting layer 160 is patterned in the respective pixel region P, full color can be displayed because the sub-pixel regions has the respective quantum dot layers 175 on the second substrate 170.

When the organic light emitting layer 160 is separately formed in each pixel region P not in each sub-pixel region, an opening portion (OA of FIG. 7D) of a metal mask (190 of FIG. 7D) for thermal deposition has about three times greater size than the opening portion of the related art that is used to form the organic light emitting layer in each sub-pixel region.

Accordingly, even though an area of the sub-pixel regions SP1 to SP3 is reduced to achieve high resolution of 250 PPI or more, because the opening portion OA of the embodiment is three times greater size than that of the related art, the opening portion OA is greater than a permissible limit (i.e., a minimum area of opening portion) of metal mask, thermal deposition using metal mask may be conducted without the problems of the related art.

The organic light emitting layer 160 may have various lamination structures, examples of which are shown in FIGS. 5A to 5D.

Figure 5A:
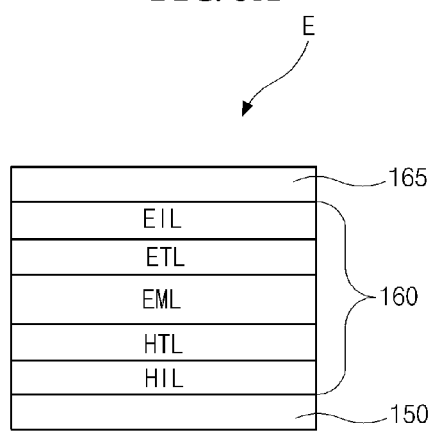
FIGS. 5A to 5D are schematic cross-sectional views illustrating examples of various lamination structures of an organic light emitting layer according to an embodiment of the present invention.

Referring to FIG. 5A, the organic light emitting layer 160 may have a quintuple-layered structure that has a hole injection layer HIL, a hole transporting layer HTL, an organic light emitting material layer EML, an electron transporting layer ETL, and an electron injection layer EIL sequentially disposed on the first electrode 150.

Figure 5B:
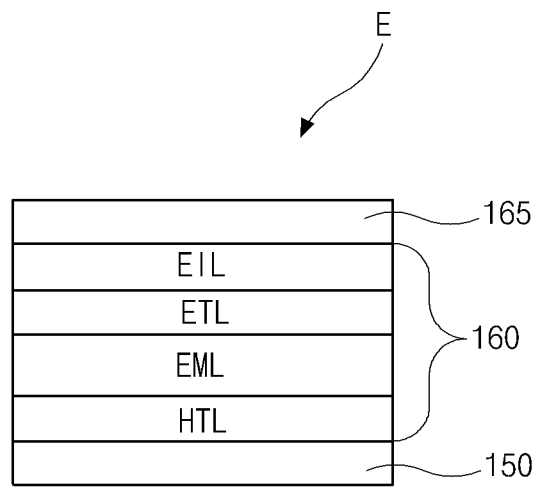
Figure 5C:
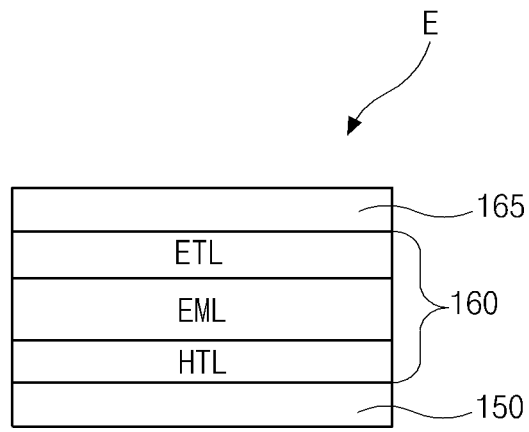

Alternatively, referring to FIG. 5B, the organic light emitting layer 160 may have a quadruple-layered structure that has a hole transporting layer HTL, an organic light emitting material layer EML, an electron transporting layer ETL, and an electron injection layer EIL sequentially disposed on the first electrode 150. Alternatively, referring to FIG. 5C, the organic light emitting layer 160 may have a triple-layered structure that has a hole transporting layer HTL, an organic light emitting material layer EML, and an electron transporting layer ETL sequentially disposed on the first electrode 150.

Figure 5D:
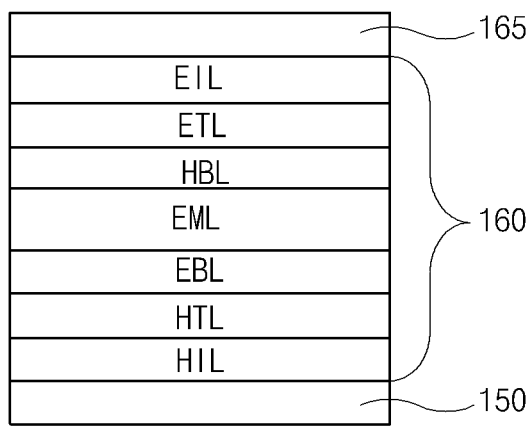

Alternatively, referring to FIG. 5D, to increase the light emission efficiency, an electron blocking layer EBL between the organic light emitting material layer EML and the hole transporting layer HTL, and a hole blocking layer HBL between the organic light emitting material layer EML and the electron transporting layer ETL may be further included in the organic light emitting layer 160. Further, the hole blocking layer HBL and the electron blocking layer EBL may be further included in the organic light emitting layer 160 of FIG. 5B or 5C.

The second electrode 165 is formed entirely in the display region on the organic light emitting layer 160.

The second electrode 165 may be made of a metal material having a low work function, for example, Al, Al alloy (e.g., AlNd), Ag, Mg, Au, or AlMg, and may function as a cathode.

The first electrode 150, the organic light emitting layer 160 and the second electrode 165 forms the organic light emitting diode E.

Even though not shown in the drawings, a capping layer may be formed on the second electrode 165, and may have a single or multiple-layered structure that uses at least one of inorganic insulating material (for example, $SiO_2$ or silicon oxide), metal silicate for insulation (for example, Hf silicate or Zr silicate), and metal nitride for insulation (for example, Si aluminate, Hf aluminate or Zr aluminate).

The second substrate 170 may be made of a transparent insulating material, for example, glass or plastic. On an inner surface of the second substrate 170, the quantum dot layers 175 are formed corresponding to the two sub-pixel regions SP1 and SP2 out of the tree sub-pixel regions SP1 to SP3.

Figure 6:
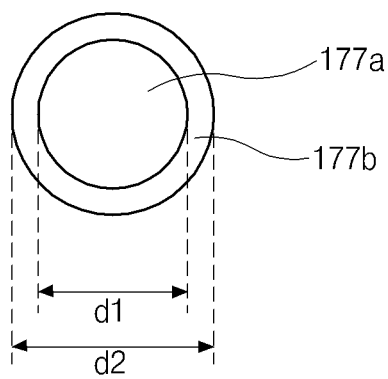
FIG. 6 is a cross-sectional view illustrating the quantum dot of the quantum dot layer of the electroluminescent device according to an embodiment of the present invention.

The quantum dot layer 175 may include a plurality of quantum dots. FIG. 6 is a cross-sectional view illustrating the quantum dot of the quantum dot layer of the electroluminescent device according to an embodiment of the present invention.

Referring to FIG. 6, the quantum dot 177 has a sphere-shaped core 177a made of at least one of II-VI group semiconductor material, III-V group semiconductor material, and IV-IV group semiconductor material, and a shell 177b enclosing the core 177a. The quantum dot emits light as excited electron moves from a conduction band to a valence band. The core 177a may be made of at least one of ZnSe, InGaP, PbS, ZnS, CdSe and PbSe.

The shell 177b may be made of ZnS or CdS.

The quantum dot 177 may further include ligand around the shell 177b.

The quantum dot has a property different from a usual fluorescent dye. When cores 177a are made of the same material, wavelengths of fluorescent light are changed according to size of the cores 177a Wavelength of fluorescent light decreases as a diameter d1 of the core 177a decreases, and thus light of desired wavelength can be emitted by adjusting the diameter d1 of the core 177a.

Further, the light emitted from the quantum dot 177 has a relatively small half-width, thus color purity is high and high color reproduction is achieved.

The diameter d1 of the core 177a may be about 1 nm to about 10 nm, and a thickness of the shell 177b may be about 0.5 nm to about 2 nm. Accordingly, a diameter of the quantum dot 177 may be about 1.5 nm to about 12 nm.

Such quantum dot 177 also has high quantum yield, and thus very strong fluorescence can be made.

Referring to FIG. 4, the quantum dot layers 175 are formed in the two sub-pixel regions SP1 and SP2, respectively, and may be omitted in the other sub-pixel region SP3.

The first and second quantum dot layers 175a and 175b of the first and second sub-pixel regions SP1 and SP2 have the quantum dots 177a in different diameters d2 and thus emit fluorescent lights in different colors.

In other words, the first quantum dot layer 175a, which has a quantum dot of a first diameter to receive a blue light from the organic light emitting diode E and make a red fluorescent light, is formed in the first sub-pixel region SP1, and the second quantum dot layer 175b, which has a quantum dot of a second diameter to receive a blue light from the organic light emitting diode E and make a green fluorescent light, is formed in the second sub-pixel region SP2. The first diameter is greater than the second diameter.

A black matrix 172 may be further formed in boundary portions among the first to third sub-pixel regions SP1 to SP3 on the inner surface of the second substrate 170.

The black matrix 172 functions to prevent the blue light from leaking through a separate region between the quantum dot layers 175a and 175b.

Even though not shown in the drawings, a protection layer may be formed on the inner surface of the second substrate 170 covering the quantum dot layers 175 in order to protect the quantum dot layers 175, and may be made of inorganic insulating material, for example, $SiO_2$ or SiNx.

The first and second substrates 110 and 170 may be coupled to each other in a vacuum condition or inert gas condition using a sealant, which is between and along peripheral portions of the first and second substrates 110 and 170, with the organic light emitting diode E and the quantum dot layer 175 facing each other, or be coupled to each other using a face seal, which is transparent and has an adhesive property, interposed between the first and second substrate 110 and 170.

The first quantum dot layer 175a of the first sub-pixel region SP1 receives the blue (B) light from the organic light emitting layer 160 and makes red (R) fluorescent light, and the second quantum dot layer 175b of the first sub-pixel region SP2 receives the blue (B) light from the organic light emitting layer 160 and makes green (G) fluorescent light. The blue (B) light from the organic light emitting layer 160 passes through the third sub-pixel region SP3 as is. Accordingly, the first to third sub-pixel regions SP1 to SP3 emit red, green and blue, respectively, and thus the organic electroluminescent device 101 can display full colors through each pixel region P.

As described above, since the organic light emitting layer 160 is separately formed in each pixel region P, the opening portion of the metal mask to thermally deposit the organic material can increase in size. Therefore, without being restricted by the use of the metal mask, an organic electroluminescent device with a high resolution and large size can be effectively achieved.

A method of manufacturing an organic electroluminescent device 101 according to the present invention is described with reference to FIGS. 7A to 7I. For the purpose of explanations, detailed processes of forming the array elements, such as the switching TFT, the driving TFT, the gate line, the data line, the power line and etc. are omitted, as these are well understood by a person of ordinary skill in the art.

Figure 7A:
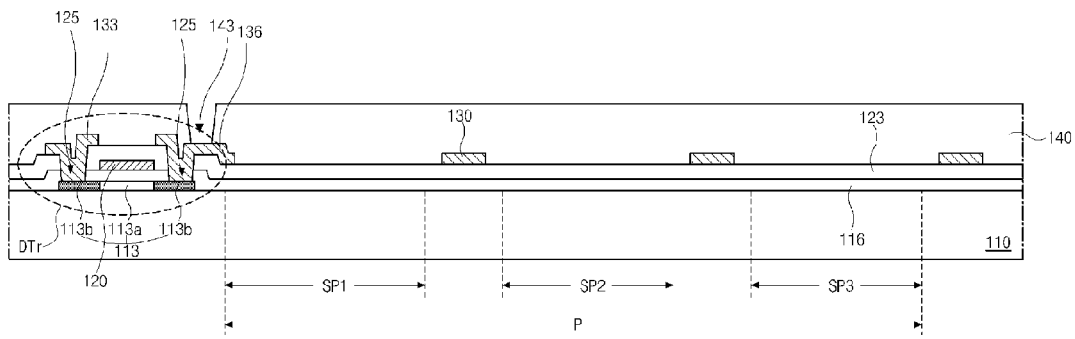
FIGS. 7A to 7I are cross-sectional views illustrating a method of manufacturing an organic electroluminescent display according to an embodiment of the present invention.

Referring to FIG. 7A, the gate lines and the data lines 130 crossing each other to define the sub-pixel regions SP1 to SP3, the power line, the switching TFT connected to the gate line and the data line 130, and the driving TFT DTr connected to the power line and the switching TFT are formed on the first substrate 110.

Then, the passivation layer 140 having the drain contact hole 143 exposing the drain electrode 136 is formed on the switching TFT and the driving TFT DTr.

Figure 7B:
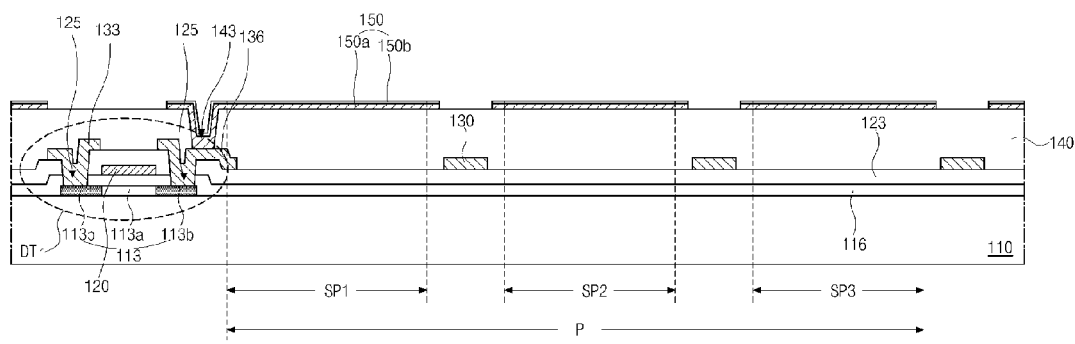

Then, referring to FIG. 7B, a transparent conductive material having a relatively high work function, for example, ITO or IZO is deposited on the passivation layer 140, and patterned in a mask process to form the first electrode 150 contacting the drain electrode 136 through the drain contact hole 143. The mask process may include forming a photoresist layer, light exposure with a photo mask, developing the light-exposed photoresist layer, an etching with the developed photoresist layer, and stripping the photoresist layer.

Alternatively, in order to increase light emission efficiency, a high reflective material, for example, Al or Al alloy (e.g., AlNd) is first deposited and then the transparent conductive material is deposited. Then, the deposited material layers are patterned in a mask process to form the first electrode 150 having the double-layered structure that includes the lower layer 150a of the high reflective material, and the upper layer 150b of the transparent conductive material.

Figure 7C:
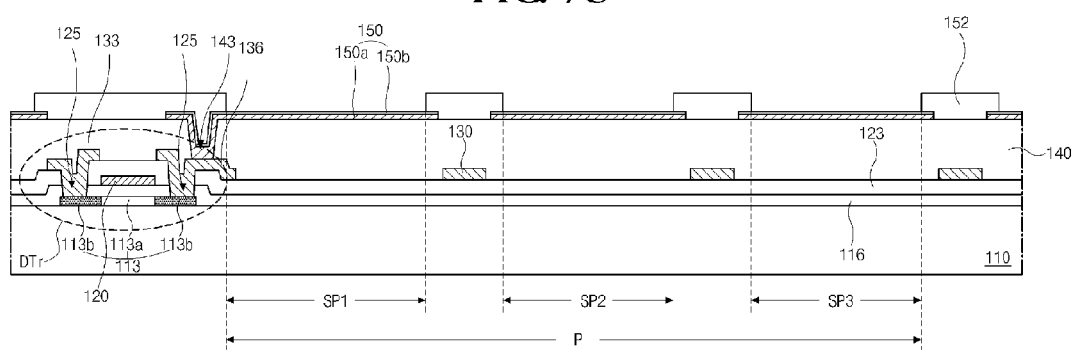

Then, referring to FIG. 7C, an insulating layer is formed on the first electrode 150, and may be made of an inorganic insulating material, for example, $SiO_2$ or SiNx, or an organic insulating material, for example, polyimide, styrene, methyl methacrylate, or polytetrafluoroethylene. The insulating layer is patterned in a mask process to form the buffer pattern 152 at the boundary portions among the sub-pixel regions SP1 to SP3 and overlapping an edge portion of the first electrode 150.

The buffer pattern 152 functions to prevent short circuit between the first electrode 150 and the second electrode 165.

Figure 7D:
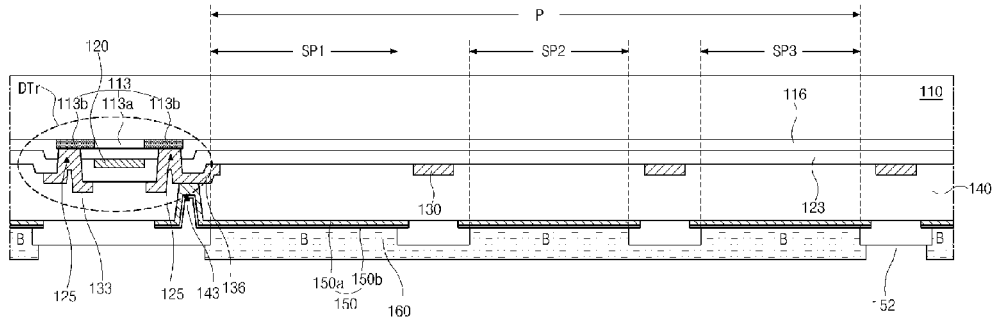

Then, referring to FIG. 7D, a metal mask 190 including an open portion OA having an area substantially corresponding to the pixel region P is placed, and a thermal deposition is performed using a thermal deposition device including a crucible having an organic light emitting material in solid state therein. Accordingly, an organic light emitting layer 160 is separately formed in each pixel region P. The organic light emitting layer 160 may emit the same color, for example, blue.

The metal mask 190 has the opening portion OA substantially corresponding to each pixel region P, which is different from the opening portion of the related art corresponding to each sub-pixel region. Accordingly, even though the area of the sub-pixel region is reduced to achieve high resolution, the opening portion OA corresponding to the pixel region P is greater than the opening portion of the related art.

Accordingly, defects due to decrease of opening portion can be prevented or reduced.

The organic light emitting layer 160 may have a single or multiple-layered structure. The multiple-layered structure is explained above with reference to FIGS. 5A to 5D.

Figure 7E:
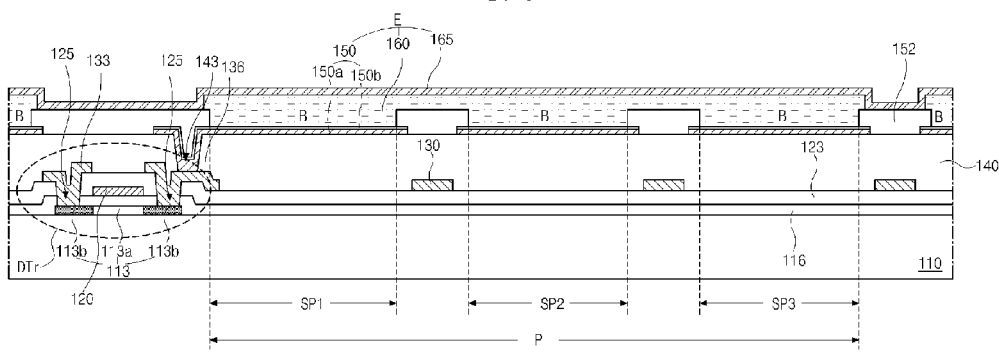

Then, referring to FIG. 7E, a second electrode 165 is formed in the entire display region on the organic light emitting layer 160, and may be made of a metal material having a relatively low work function, for example, at least one of Al, Al alloy (e.g., AlNd), Ag, Mg, Au and AlMg.

Through the above-described processes, the array substrate 110 is manufactured.

Even though not shown in the drawings, a capping layer may be formed on the second electrode 165, and may have a single or multiple-layered structure that uses at least one of inorganic insulating material (for example, $SiO_2$ or silicon oxide), metal silicate for insulation (for example, Hf silicate or Zr silicate), and metal nitride for insulation (for example, Si aluminate, Hf aluminate or Zr aluminate).

Figure 7F:
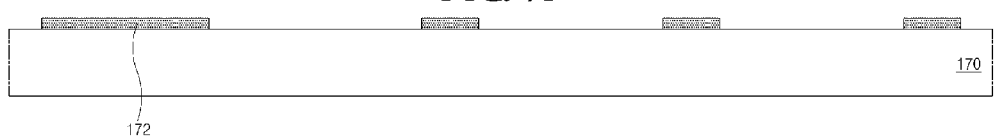

Then, referring to FIG. 7F, a second substrate 170 is prepared, and a material having light-absorbing property, for example, a black resin is formed on the second substrate 170 and patterned in a mask process to form the black matrix 172 among the sub-pixel regions SP1 to SP3.

Alternatively, the black matrix 172 may not be formed.

Figure 7G:
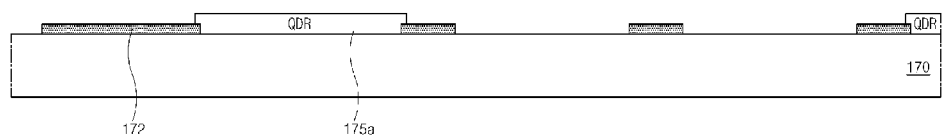

Then, referring to FIG. 7G, a quantum dot, which has a first diameter and changes a first color light, for example, a blue light incident thereon into a red fluorescent light, is coated entirely on the second substrate 170, and is patterned in a mask process to form the first quantum dot layer 175a in the first sub-pixel region SP1 among the three sub-pixel regions SP1 to SP3 of each pixel region P.

Alternatively, the quantum dot with a solvent in liquid state is selectively coated corresponding to the first sub-pixel region SP1 using an inkjet device, and a thermal treatment is then performed to remove the solvent, and thus the quantum dot layer 175a can be formed.

Figure 7H:
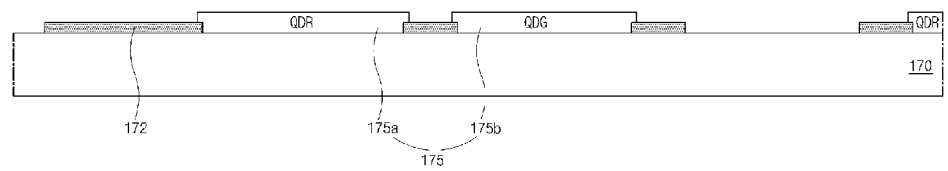

Then, referring to FIG. 7H, in a similar way to forming the first quantum dot layer 175a, the second quantum dot layer 175b including a quantum dot, which has a second diameter and changes the blue light incident thereon into a green fluorescent light, is formed in the second sub-pixel region SP2.

Even though not shown in the drawings, a protection layer may be formed entirely on the second substrate 170 having the quantum dot layers 175, and may be made of inorganic insulating material, for example, $SiO_2$ or SiNx.

Figure 7I:
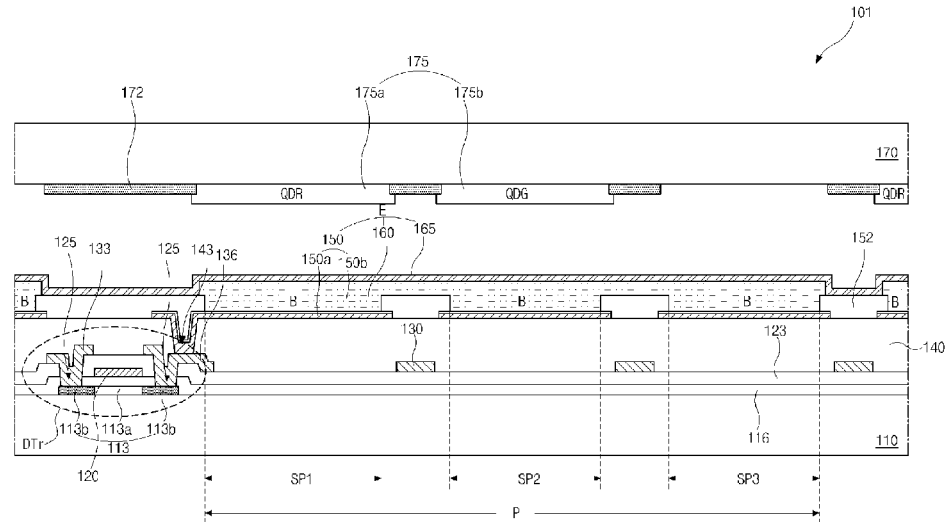

Then, referring to FIG. 7I, the first and second substrates 110 manufactured above are arranged with the second electrode 165 and the quantum dot layer 175 facing each other, and are coupled to each other in a vacuum condition or inert gas condition using a sealant which is between and along peripheral portions of the first and second substrates 110 and 170. Alternatively, the first and second substrates 110 and 170 are coupled to each other by coating a face seal, which is transparent and has an adhesive property, on one of the first and second substrates 110 and 170. By coupling the first and second substrates 110 and 170, the organic electroluminescent device 101 is manufactured.

As described above, since the organic light emitting layer emitting one color is separately formed in each pixel region P, the opening portion of the metal mask to thermally deposit the organic material can increase in size. Therefore, without being restricted by the use of the metal mask, an organic electroluminescent device with a high resolution and large size can be effectively achieved.

Moreover, the quantum dot layers emitting two of red, green and blue are formed on the second substrate, and a half-width of dominant wavelength band of fluorescent light emitted from the quantum dot layer is narrower than light emitted from the organic light emitting layer. Accordingly, color reproduction rate can be improved.

Moreover, the thermal deposition using the metal mask is performed and high resolution of 250 PPI or more is obtained as well, and thus display quality can be improved.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic electroluminescent device, comprising:
 a first substrate including a plurality of pixel regions, each having three sub-pixel regions;
 a driving transistor in each sub-pixel region on the first substrate;
 a first electrode in each sub-pixel region on the driving transistor, the first electrode physically being in contact with the driving transistor;
 an organic light emitting layer in each pixel region on the first electrode;
 a second electrode on the organic light emitting layer;
 a second substrate facing the first substrate; and
 quantum dot layers between an inner surface of the second substrate and the second electrode and corresponding to at least two of the three sub-pixel regions.

2. The device according to claim 1, wherein the organic light emitting layer is configured to emit one color in each pixel region.

3. The device according to claim 2, wherein the quantum dot layers corresponding to the two sub-pixel regions are configured to emit different colors.

4. The device according to claim 3, wherein the organic light emitting layer is configured to emit blue, and the quantum dot layers corresponding to the two sub-pixel regions are configured to emit red and green, respectively.

5. The device according to claim 1, further comprising a black matrix on the inner surface of the second substrate corresponding to boundary portions among the three sub-pixel regions.

6. The device according to claim 1, further comprising;
a capping layer on the second electrode; and
a protection layer covering the quantum dot layers.

7. The device according to claim 1, wherein each quantum dot layer includes a plurality of quantum dots,
wherein the quantum dot includes a core, and a shell enclosing the core, and
wherein the core is made of at least one of II-VI group semiconductor material, III-V group semiconductor material, and IV-IV group semiconductor material.

8. The device according to claim 7, wherein the core is made of at least one of ZnSe, InGaP, PbS, ZnS, CdSe and PbSe, and
wherein the shell is made of ZnS or CdS.

9. The device according to claim 1, further comprising:
gate and data lines crossing each other to define each sub-pixel region, and a power line parallel with and spaced apart from one of the gate and data lines, on the first substrate;
a switching thin film transistor connected to the gate and data lines, and a driving thin film transistor connected to the switching thin film transistor and the power line, in each sub-pixel region on the first substrate; and
a buffer pattern at boundary portions among the three sub-pixel regions.

10. The device according to claim 1, wherein the organic light emitting layer has a multiple-layered structure,
wherein the organic light emitting layer includes:
an organic light emitting material layer;
at least one of a hole injection layer, a hole transporting layer, and an electron blocking layer between the first electrode and the organic light emitting material layer; and
at least one of an electron injection layer, an electron transporting layer, and a hole blocking layer between the second electrode and the organic light emitting material layer.

11. A method of manufacturing an organic electroluminescent device that includes a plurality of pixel regions, each having three sub-pixel regions, the method comprising:
forming a first electrode in each sub-pixel region on a first substrate;
forming an organic light emitting layer in each pixel region on the first electrode;
forming a second electrode on the organic light emitting layer;
forming quantum dot layers on an inner surface of a second substrate facing the first substrate and corresponding to at least two of the three sub-pixel regions; and
coupling the first and second substrates.

12. The method according to claim 11, wherein forming the organic light emitting layer includes:
placing a metal mask over the first electrode and including an open portion corresponding to each pixel region; and
thermally depositing an organic light emitting material using a thermal deposition device to form the organic light emitting layer in each pixel region on the first electrode.

13. The method according to claim 11, wherein forming the quantum dot layers includes:
forming a first quantum dot material layer entirely on the second substrate and patterning the first quantum dot material layer to form a first quantum dot layer in a first sub-pixel region of the three sub-pixel regions; and
forming a second quantum dot material layer entirely on the second substrate having the first quantum dot layer and patterning the second quantum dot material layer to form the first quantum dot layer in a second sub-pixel region of the three sub-pixel regions.

14. The method according to claim 11, wherein forming the quantum dot layers includes:
selectively forming a first quantum dot layer in a first sub-pixel region of the three sub-pixel regions on the second substrate using a inkjet device; and
selectively forming a second quantum dot layer in a second sub-pixel region of the three sub-pixel regions on the second substrate having the first quantum dot layer using a inkjet device.

15. The method according to claim 11, further comprising forming a black matrix on the inner surface of the second substrate corresponding to boundary portions among the three sub-pixel regions before forming the quantum dot layers.

16. The method according to claim 11, further comprising;
forming a capping layer on the second electrode; and
forming a protection layer covering the quantum dot layers.

17. The method according to claim 11, further comprising:
forming gate and data lines crossing each other to define each sub-pixel region, and a power line parallel with and spaced apart from one of the gate and data lines, on the first substrate, before forming the first electrode;
forming a switching thin film transistor connected to the gate and data lines, and a driving thin film transistor connected to the switching thin film transistor and the power line, in each sub-pixel region on the first substrate, before forming the first electrode; and
forming a buffer pattern at boundary portions among the three sub-pixel regions, before forming the first electrode.

18. The method according to claim 11, wherein the organic light emitting layer has a multiple-layered structure,
wherein the organic light emitting layer includes:
an organic light emitting material layer;
at least one of a hole injection layer, a hole transporting layer, and an electron blocking layer between the first electrode and the organic light emitting material layer; and
at least one of an electron injection layer, an electron transporting layer, and a hole blocking layer between the second electrode and the organic light emitting material layer.

* * * * *